United States Patent [19]

Tokuda et al.

[11] Patent Number: 4,893,170

[45] Date of Patent: Jan. 9, 1990

[54] SEMICONDUCTOR DEVICE WITH MULTI-LEVEL WIRING IN A GATE ARRAY

[75] Inventors: Takeshi Tokuda, Osaka; Jirou Korematsu, Itami; Osamu Tomisawa, Nishinomiya, all of Japan

[73] Assignee: Mitsubishi Denki Kabushiki Kaisha, Tokyo, Japan

[21] Appl. No.: 599,064

[22] Filed: Apr. 11, 1984

[30] Foreign Application Priority Data

Jun. 24, 1983 [JP] Japan .................................. 58-114602

[51] Int. Cl.⁴ ....................... H01L 27/10; H01L 29/52
[52] U.S. Cl. .......................................... 357/71; 357/45
[58] Field of Search ..................................... 357/71, 45

[56] References Cited

U.S. PATENT DOCUMENTS 4,412,237 10/1983 Hatsumura et al. ................... 357/45

FOREIGN PATENT DOCUMENTS 53-63876 6/1978 Japan ..................................... 357/45

Primary Examiner—Andrew J. James
Assistant Examiner—Jerome Jackson, Jr.
Attorney, Agent, or Firm—Birch, Stewart, Kolasch & Birch

[57] ABSTRACT

A semiconductor device is designed and layed out to have a multiple-layer wiring structure and a logic gate cell structure. The multiple-layer wiring structure is constituted by wiring layers each being a vertical wiring layer for producing vertical wirings or a horizontal wiring layer for producing horizontal wirings, and either of the vertical or horizontal wiring layer is provided in plurality. One of the layers of the plurality of wiring layers is that for producing wirings which constitute input terminals of logic gates, and another layer of the plurality of wiring layers is that for producing wirings which constitute output terminals of logic gates. Wiring is carried out along each wiring grid which is provided for each of the plurality of wiring layers so that lines of different grids are alternately arranged.

17 Claims, 5 Drawing Sheets

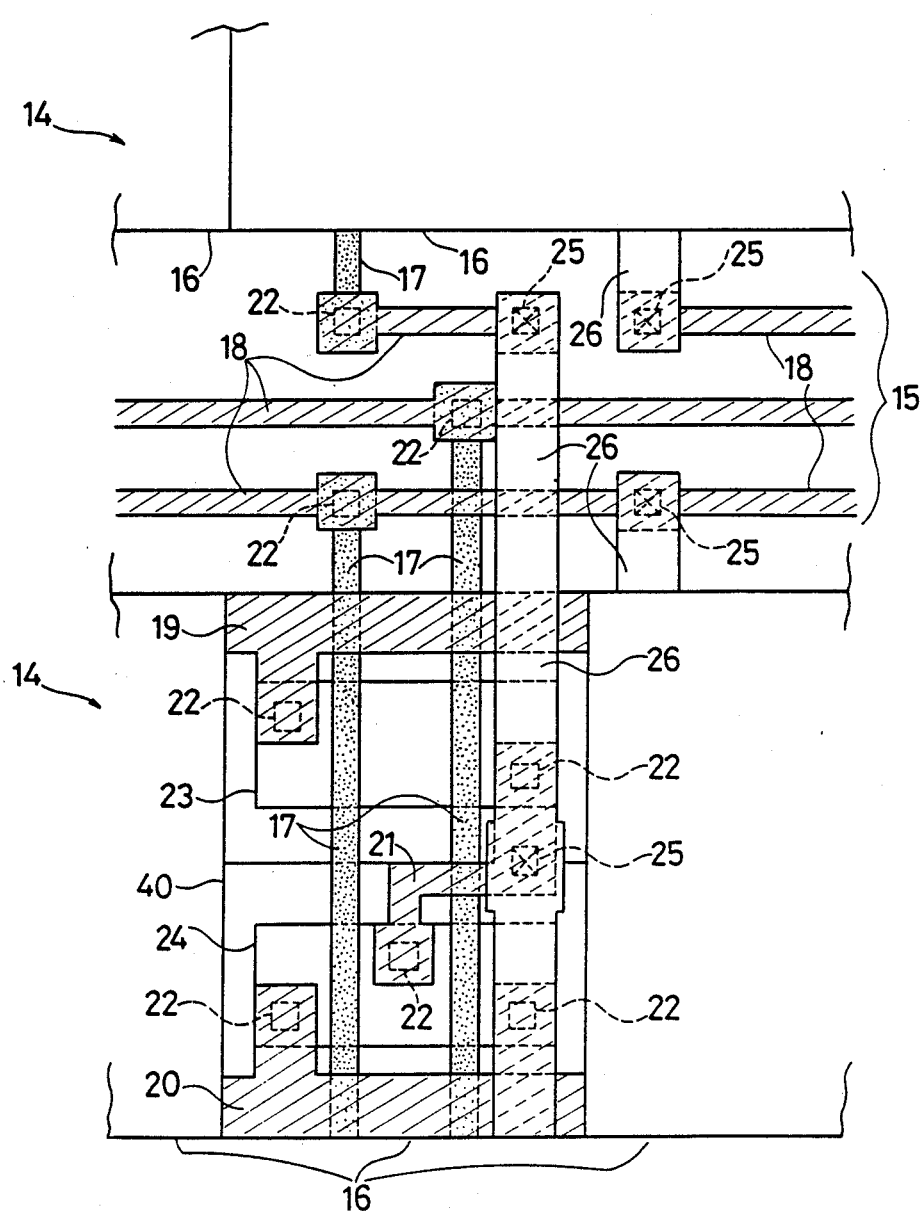
F I G .3.

F I G .4.
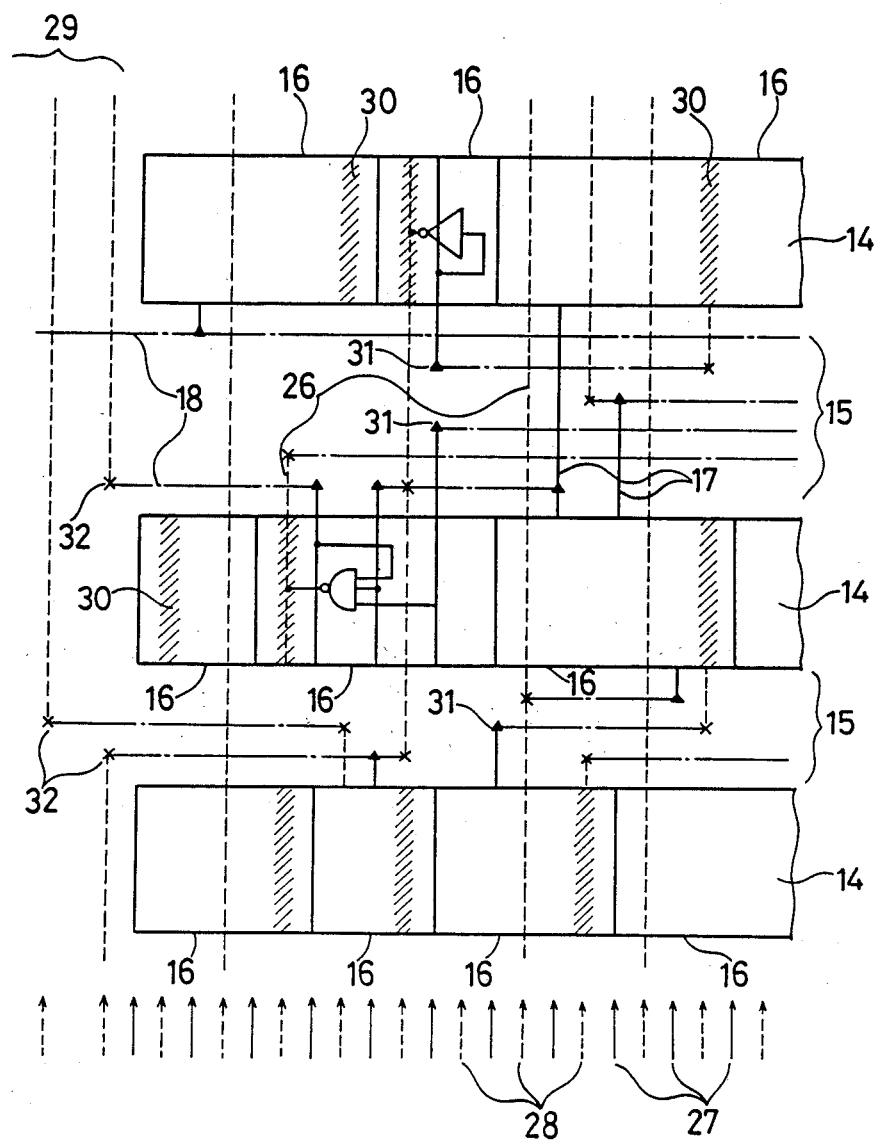

SEMICONDUCTOR DEVICE WITH MULTI-LEVEL WIRING IN A GATE ARRAY

FIELD OF THE INVENTION

The present invention relates to a semiconductor device, especially to a multiple-layer wiring structure or a logic gate cell structure which enables an automatic layout in very large scale integrated circuits (hereinafter referred to as "VLSI"), and further enables a high-speed operation and a high integration.

BACKGROUND OF THE INVENTION

A hand-crafted layout design of a logic LSI can yield a high degree of circuit integration but the integration comes at the expense of time and a high cost. Therefore, the layout design by a hand-craft has become a non-realistic technique except for the design of those parts of general-purpose LSIs which are to be mass-produced. An automatic layout design is more practical. In this automatic layout design, placement of elements and wiring are carried out automatically using standard cells which are designed with their operations verified beforehand. It is usually described as "a standard cell system" or "a gate array system".

However, in this automatic design technique, it is quite difficult for a placement wiring program to attain the high density wiring that can be done by a layout designer. Conventionally in the automatic layout design a double layer wiring system is used whereby a vertical and a horizontal wiring are provided from different wiring layers respectively. Furthermore, in automatic layout designs of silicon gate MOS devices which have high integration and low power consumption, two kinds of wiring systems are used.

The first kind of wiring system is that which uses a double-layer wiring structure which consists of a gate metal layer composed of polysilicon (polycrystalline silicon) or the like constituting the gates of MOS transistors as a first (for example, vertical) wiring layer, and a low-resistance metal wiring layer composed of aluminum or the like for connection to the sources or drains of MOS transistors as a second (for example, horizontal) wiring layer.

In FIG. 1 shows this first kind of wiring structure. The numeral 1 indicates a cell bench where standard cells which will be described later are placed. The numeral 2 indicates a wiring region designated as the horizontal wiring channel. The numeral 3 indicates a standard cell which is obtained by implementing a logic gate, for example, an inverter, a 2-input NOR gate, or 3-input NAND gate, in a cell according to a layout design. The numeral 4 indicates a vertical wiring composed of a gate metal layer. The numeral 5 indicates a horizontal wiring composed of an aluminum wiring layer. The numeral 6 and 7 indicate a power supply wiring and a ground wiring respectively. The numeral 8 indicates an aluminum wiring used as a lead for a drain electrode. The numeral 9 indicates a contact for connecting between the diffused region and the aluminum wiring layer or between the gate metal layer and the aluminum wiring layer. The numeral 10 and 11 indicate a P-type impurity region and an N-type impurity region respectively. The numeral 40 indicates a P-well region.

In this type of wiring structure, wirings for input/output terminals of cells are wired by using vertical wirings 4 and horizontal wirings 5 in accordance with information for connections between the cells. The power supply wiring 6 and ground wiring 7 in the standard cell run in the horizontal direction, being composed of an aluminum wiring respectively. An output terminal of a logic gate is let out by a vertical wiring 4 of a gate metal layer through an aluminum wiring 8 which connects the drains of a P-channel transistor and a N-channel transistor. The drain of the P-channel transistor consists of the region 10 which is constructed by diffusing P-type impurities into the N-type semiconductor substrate. The drain of N-channel transistor consists of the N-type impurity region 11 which is produced by diffusing N-type impurities into the P-well region 40 which is produced by diffusing P-type impurities into the semiconductor substrate. A logic LSI is layed out by using standard cells and wiring regions of such structure. This conventional structure has as its feature the capability of realizing the LSI by the conventional wiring process of a polysilicon gate and single-layer aluminum.

The second kind of wiring system is that which uses a double layer aluminum wiring structure, mainly aiming to improve the operation speed of the first kind of wiring system. The structure is shown in FIG. 2.

In FIG. 2, it is a fundamental arrangement that horizontal wirings are constructed of a first low-resistance metal wiring layer 5 (a first aluminum wiring layer) and that vertical wirings are constructed of a second low-resistance metal wiring layer 13 (a second aluminum wiring layer), whereby wiring is carried out between the standard cells. In addition, a gate metal wiring layer 4 which has high-resistance relative to the first and second low-resistance wiring layer 5, 13 is used only for wiring in the standard cell, not being used in the wirings region between the cells. The numeral 12 indicates a through hole for connecting between the first and the second aluminum wiring.

One advantage of this system resides in that wiring is carried out by using low-resistance wiring layers, which results in only a small resistance due to the wirings, which allows the device to obtain a higher gate operation speed. Another advantage of this system is the ability to easily calculate the delay time of the gate which should be used in logical verifications and timing verifications of LSIs from only capacities, for example, capacitances of the wirings input capacitances of the logic gate which is to be driven, and so on.

However, it is non-advantageous to use a gate metal layer which has generally a high-resistance per unit length as a vertical wiring layer in view of operation speed of a logic LSI in the conventional semiconductor device, especially in the double-layer wiring structure described above as a first kind of wiring system. That is, in this double-layer wiring structure, it is fundamentally necessary to construct feed through wirings (not shown in FIG. 1) which are vertical wirings provided between the cells by gate metal wiring layers resulting in the increased length of the gate metal wiring and hence an increase in wiring resistance. The length of the gate metal wiring becomes also considerably lengthy when there is provided a vertical wiring region in order to increase the wiring density. In this case, a large resistance arises in the wiring, and the operation speed of the logic gate decreases significantly. Accordingly, it is necessary to add an element in the placement/wiring program that replace the gate metal wiring by an aluminum wiring in those regions where a long gate metal wiring does not cross with an aluminum wiring in order to avoid a slow down of the operation speed. Without this element it is unable to use the program in a design of a high speed LSI. Furthermore, it becomes difficult to predict or calculate the delay time of a logic gate before the production thereof because of its resistance.

Additionally, in the double-layer wiring structure which is described above as a second kind of wiring system, there is a disadvantage in that the gate metal wiring is only used for providing gate electrodes and not used for providing wirings. Furthermore, it is necessary to provide excess regions composed of the first metal (horizontal) wiring layer in order to connect the gate metal with the second metal (vertical) wiring layer, resulting in less than optional operation speed and a lower degree of integration of LSIs. This is because it is impossible to make the second metal wiring layer in contact with the gate metal directly because of the thickness of the insulating layer that is inserted between the layers in the manufacturing process for MOS devices or the like. Providing excess regions composed of the first metal wiring layer also prevents providing a feed through above the excess regions using the second metal wiring layer.

SUMMARY OF THE INVENTION

The present invention is directed to solve the problems pointed out above, and has as its object a semiconductor device in which a high wiring density is achieved in logical VLSI without reduction in operation speed.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, the semiconductor device is of a multiple-layer wiring structure where each of the vertical wirings is provided by a vertical wiring layer, each of the horizontal wirings is provided by a horizontal wiring layer, either of the vertical or the horizontal wiring layer can be provided in plurality, one and another of the plurality of wiring layers constitute wiring including input and output terminals of logic gates respectively, and wiring is carried out along each wiring grid which is prepared for each of the plurality of wiring layers so that the lines of different grids are alternately arranged.

BRIEF DESCRIPTION OF THE DRAWINGS

FIG. 3 is a pattern diagram of an embodiment of the present invention;

FIG. 4 is a detailed pattern diagram showing such a triple-layer wiring structure as shown in FIG. 3.

DETAILED DESCRIPTION OF THE INVENTION

Figure 1:
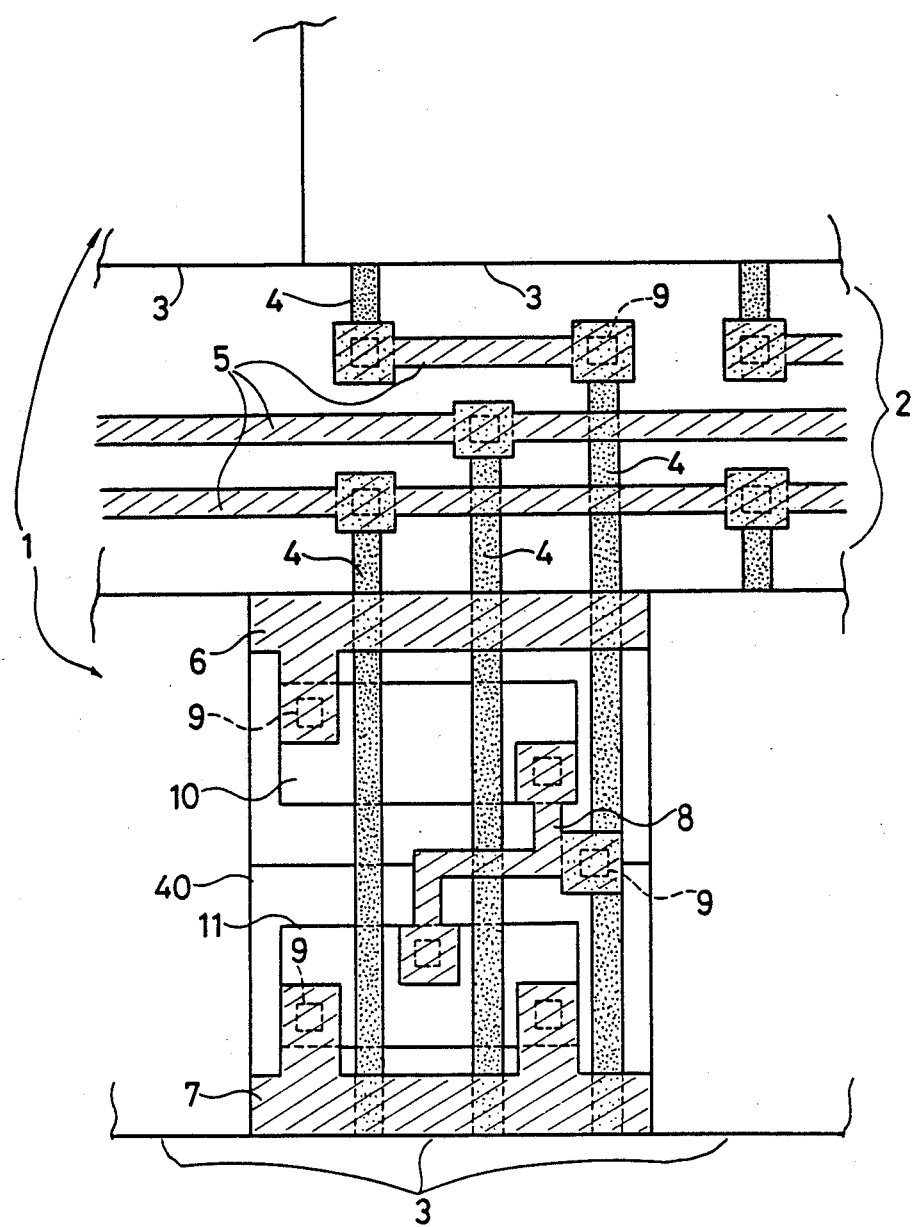
FIG. 1 is a pattern diagram of a conventional semiconductor device.
Figure 2:
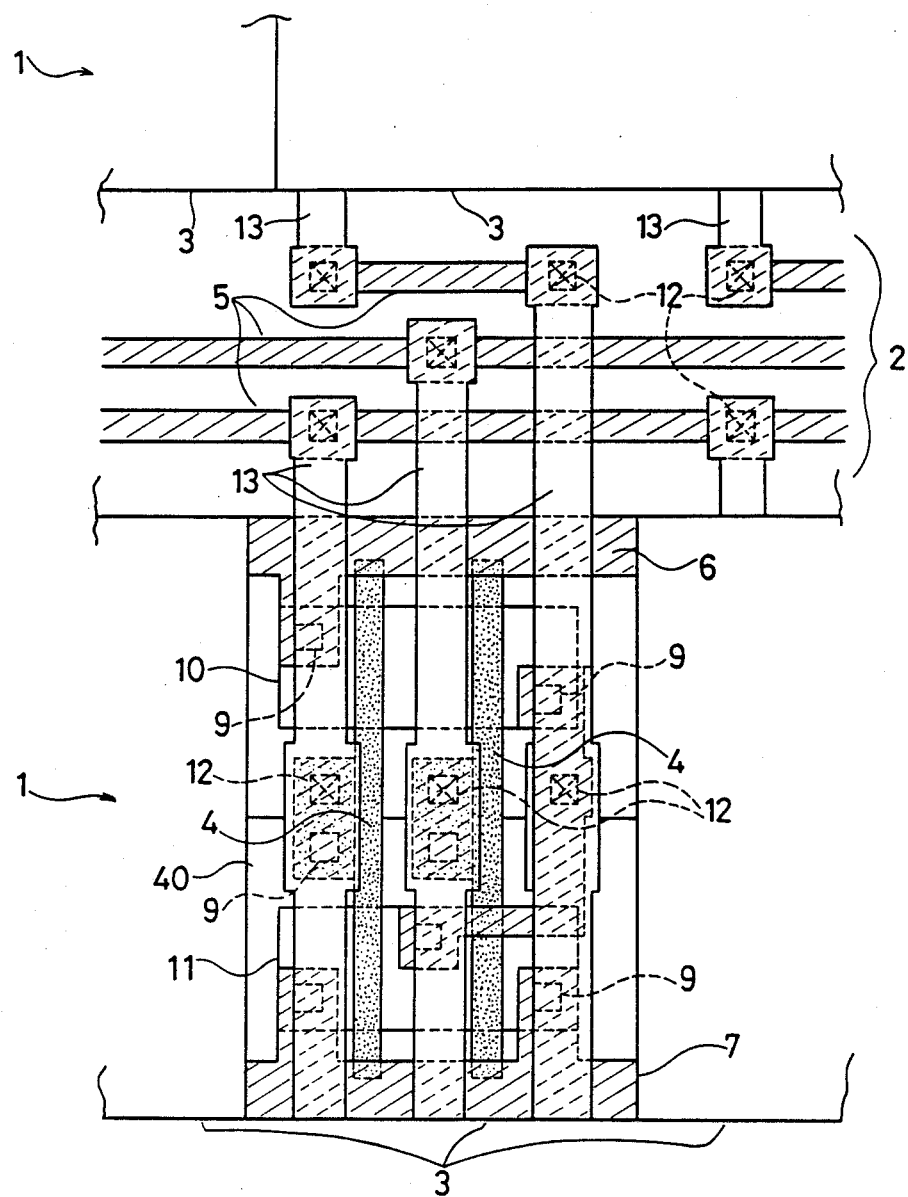
FIG. 2 is a pattern diagram of another conventional semiconductor device.

FIG. 3 shows an embodiment of the present invention. The numeral 14 indicates a standard cell bench where standard cells which will be described later are arranged in the horizontal direction. The numeral 15 indicates a wiring region called the horizontal channel. The numeral 16 indicates a standard cell implementing a 2-input CMOS NOR gate designed to be produced by a CMOS process using a polysilicon gate, and a double-layer aluminum wiring system. The numeral 17 indicates vertical wirings comprising polysilicon. The vertical wirings 17, composed of a single-layer structure, where N-type impurities are diffused, constitute the gates of a P-channel transistor and an N-channel transistor which will be described later, and they also constitute input terminals of a 2-input NOR gate. The numeral 18 indicates a horizontal wiring produced from a first aluminum wiring layer. The numerals 19 and 20 indicate a power supply ($V_{DD}$) wiring and a ground wiring respectively running horizontally, produced from the first aluminum wiring layer. The numeral 21 indicates a wiring for a lead of drain electrode comprising the first aluminum wiring layer. The numeral 22 indicates contacts for connecting between the diffused region and the first aluminum wiring layer, or between the polysilicon layer and the first aluminum wiring layer. The numeral 23 indicates a P-type impurity diffused region constituting the source or drain of a P-channel transistor. The numeral 24 indicates an N-type impurity diffused region which region is produced by diffusing N-type impurities into the P-well region constituting the source and drain of an N-channel transistor. The numeral 25 indicates a through hole for connecting between the first aluminum wiring and the second aluminum wiring. The numeral 26 indicates a wiring that is the output terminal of a 2-input NOR gate comprising, that is, produced from a second aluminum wiring layer. Thus, the drains of both transistors 23 and 24 are connected to each other by the first aluminum wiring 21, and the first aluminum wiring 21 is connected to the second aluminum wiring 26 via a through hole 25.

In the standard cell 16 implementing a NOR gate which has only one output, it is possible to provide two pieces of vertical wirings which run through the cell (they are called feed through wirings) above the two gate metal wirings 17 constituting input terminals of the cell. This means that a broad feed through region can be provided over the cells. The input and output terminals are designed to be located on the lines of the wiring grids (corresponding to 27 and 28 shown in FIG. 4) which are established for the gate metal wiring and the second aluminum wiring layer respectively. The horizontal length of the standard cell 16 is designed to be a multiple (even number multiple) of the interval of each of the vertical wiring grids, and the left and right end of the cell are located on the lines of the grid for an input terminal.

In summary, the first feature of the wiring structure and the cell structure of the present embodiment resides in the adaption of the triple-layer wiring structure where the gate metal wiring layer 17 comprising a polysilicon wiring layer, and the second low-resistance metal wiring layer 26 comprising a second aluminum wiring layer are constituted as vertical wirings respectively, and the first low-resistance metal wiring layer 18 is constituted as a horizontal wiring, thereby resulting in the efficient use of the gate metal wiring layer for wirings between the standard cells within one channel.

The second feature of the present embodiment resides in that the gate metal wiring which, produced from a first vertical wiring, constitutes an input terminal of a logic gate and the second aluminum wiring which, produced from a second vertical wiring layer, constitutes an output terminal of a logic gate or a feed through are arranged alternately, each along the lines of the vertical wiring grids. In other words, the lines of different grids are alternately arranged, thereby resulting in the high wiring density as a whole.

In the embodiment shown in FIG. 3, the horizontal wirings 18 are arranged along the lines of the horizontal wiring grid which is established for the horizontal wiring layer and has the same interval as that of the wirings 18. However, it is, of course, not only possible but desirable not to provide the horizontal wiring grid in view of increasing the wiring density in the wiring region 15, it being called as a y-direction grid free system. In such a y-direction grid free system, a horizontal wiring is arranged so as to have the permissible minimum distance between itself and an adjacent horizontal wiring which is a minimum distance allowed to be laid between two horizontal wirings, or is arranged so as to have the permissible minimum distance between itself and an adjacent contact for connecting between the horizontal wiring and the first or second vertical wiring, thereby resulting in the high wiring density.

In FIG. 4 which shows the detailed pattern of such a triple-wiring structure as shown in FIG. 3, the numerals 27 and 28 indicate a wiring grid for a first vertical wiring layer (a gate metal wiring layer) and a wiring grid for a second vertical wiring layer (a second aluminum wiring layer) respectively, the numeral 29 indicates a wiring region designated a vertical wiring channel, and the numeral 30 represented by diagonal lines indicates a feed through inhibiting region. The numeral 31 indicates a contact for connecting between the gate metal wiring and the first aluminum wiring, and the numeral 32 indicates a contact for connecting between the first aluminum wiring and the second aluminum wiring.

In this type of triple-layer wiring structure, the triple-layer wiring is realized by first vertical wirings and second vertical wirings located along the first vertical wiring grid 27 and the second vertical wiring grid 28 respectively, and further horizontal wirings (first aluminum wirings). The wirings in the wiring region 29 are constructed by using a double-layer wiring structure which consists of the second vertical wirings and the horizontal wirings, not using a high-resistance wiring layer (a gate metal wiring layer), whereby a high density wiring is realized as a whole while keeping a clearance between the wirings of each wiring layer as the minimum design rule. It is necessary to provide two kinds of contacts for connecting between the wiring layers, that is, the contacts 31 for connecting between the gate metal wirings and the first aluminum wirings and the contacts 32 for connecting between the first aluminum wirings and the second aluminum wirings. The output signal of the logic gate which is led out by the second aluminum wiring (second vertical wiring) 26 is wired on the chip using the horizontal wiring 18 and the second vertical wiring 26 (second vertical wiring), and the portion thereof which leads to the input of a logic gate is wired by only using the first vertical wiring which are located on the lines of the vertical wiring grid except for the portion thereof represented by diagonal lines in the standard cell 16 in FIG. 4, can be used for feed, thereby enabling a high density wiring. In the wiring rule of the present embodiment, it is a feature that the second vertical wirings can be used to provide a feed through wirings over the cell.

Figure 5:
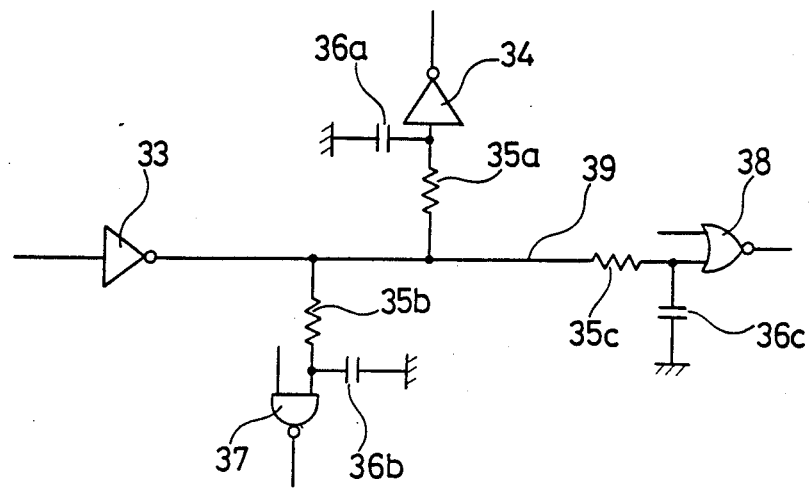
FIG. 5 is a circuit diagram of an equivalent circuit of the wiring structure of FIG. 4.

FIG. 5 shows the equivalent circuit of the wiring structure shown in FIG. 4. In FIG. 5, the numerals 33 and 34 indicate inverters, the numerals 35a to 35c indicate resistances caused by the gate metal wiring layers, the numerals 36a to 36c indicate capacities added to the input terminals of the gates, the numeral 37 indicates a NAND gate, the numeral 38 indicates a NOR gate, and the numeral 39 indicates a wiring constituted by the first aluminum wiring and the second aluminum wiring.

In this equivalent circuit, any resistance is not inserted into the output terminals of logic gates represented by the inverter 33, and the resistance 35 is inserted only into the input terminals of the gates. Furthermore, the length of the gate metal which gives rise to a resistant component is restricted to a value which is lower than the height of the horizontal channel, thereby reducing the resistance of the gate metal wiring to a great extent. For example, when the height of the cell is approximately 50 $\mu$m, the height of the horizontal wiring channel is approximately 150 $\mu$ m, the sheet resistance of the gate metal is 40 $\Omega/\square$, and the width of the gate metal wiring is 3 $\mu$m, the resistance becomes 2000 $\Omega(=\Omega/\square \times 150\ \mu m/3\mu m)$ at a maximum value. If it is presumed that the input capacitance 36 of the gate is approximately 0.1 pF, the delay time of a signal caused by the resistant component becomes 0.20 ns, being negligible relative to the delay time of a gate which is almost 2 to 5 ns.

The above-described embodiment is concerned with CMOS devices, but it is, of course, possible to apply the present invention to a NE/D (N-channel Enhancement Depletion MOS) devices.

What is claimed is:

1. A semiconductor device of a multiple-layer wiring structure comprising:
   a plurality of logic gate cells;
   a wiring channel-containing wiring connections between said logic gate cells;
   vertical wirings each of which is contained in a vertical wiring layer;
   horizontal wirings each of which is contained in a horizontal wiring layer;
   either of said vertical or horizontal wiring layers being provided in plurality;
   wirings of one of said wiring layers that is provided in plurality being used as wirings for input terminals of logic gates of said logic gate cell and being connected to other wirings in said wiring channel;
   another wiring layer of one of said wiring layers that is provided in plurality being used as wirings for output terminals of logic gates of said logic gate cell connected to other wires in said wiring channel where said wirings are disposed along a wiring grid in said wiring channel;
   said wiring grid being established for each of said wiring layers that is provided in plurality so that the lines of different ones of said grids are alternately arranged.

2. The semiconductor device as defined in claim 1, wherein the device is of a triple-layer wiring structure comprising:
   a first vertical wiring layer composed of a single- or multiple-layer gate metal containing wirings which constitute gates of silicon gate MOS transistors which gates are input terminals of logic gates of one of said plurality of logic gate cells;
   a horizontal wiring layer composed of a first low-resistance metal layer containing wirings which interconnect a first controlled terminal and a second controlled terminal of said silicon gate MOS transistors; and a second vertical wiring layer composed of a second low-resistance metal layer containing wirings which constitute output terminals of logic gates, said second vertical wiring layer being formed above said first low-resistance metal layer with an insulating layer inserted therebetween.

3. A semiconductor device as defined in claim 2, wherein there is provided a triple-layer wiring structure with a gate metal wiring forming an input terminal of a logic gate of one of said plurality of logic gate cells, said gate metal wiring being along said first vertical wiring layer of said wiring grid, and a drain electrode of a MOS transistor is composed of said second low-resistance wiring layer and forming an output terminal of a logic gate of said logic gate cell, said output terminal being disposed along said second vertical wiring layer of said wiring grid.

4. A semiconductor device as defined in claim 3, wherein a wiring which starts from an output terminal of a logic gate of one of said plurality of logic gate cells is operatively connected to an input terminal of another one of said plurality of said logic gate cells and is constituted by said second low-resistance metal wiring layer, by using said first low-resistance metal wiring layer, second low-resistance metal wiring layer, and a portion of wiring which is an input terminal of said other of said plurality of logic gate cells which is constituted by the gate metal wiring layer.

5. A semiconductor device having a multiple-layer wiring structure comprising:

a semiconductor substrate including logic gate cells and a wiring channel extending in a first direction along said substrate;

semiconductor device formed in said logic gate cells;

a first wiring layer formed over said substrate and including first wirings, each said first wiring extending from a said logic gate cell into said wiring channel substantially orthogonal to said first direction;

a second wiring layer formed over said substrate and said first wiring layer, said second wiring layer including internal cell wirings, and second wirings extending along said wiring channel parallel to said first direction; and a third wiring layer formed over said substrate and said first and second wiring layers, said third wiring layer including third wirings, each said third wiring extending from a said logic gate cell into said wiring channel;

said first and third wirings being each electrically interconnected to at least one said second wiring.

6. The semiconductor device of claim 5 wherein one of said first wirings and said third wirings form input terminals for said logic gate cells and the others of said first wirings and said third wirings form output terminals for said logic gate cells.

7. The semiconductor device of claim 5 wherein said first wiring form input terminals for said logic gate cells and said third wirings form output terminals for said logic gate cells.

8. The semiconductor device of claim 5 wherein said first wirings are formed of polysilicon.

9. The semiconductor device of claim 7 wherein said first wirings are formed of polysilicon.

10. The semiconductor device of claim 5 wherein said second and third wiring layers are formed of a low resistance metal.

11. The semiconductor device of claim 7 wherein said second and third wiring layers are formed of a low resistance metal.

12. The semiconductor device of claim 10 wherein said low resistance metal is aluminum.

13. The semiconductor device of claim 11 wherein said low resistance metal is aluminum.

14. The semiconductor device of claim 5 wherein said semiconductor devices are silicon gate MOS transistors.

15. The semiconductor device of claim 5 wherein said first wirings comprise input lines for said transistors logic gate cells.

16. The semiconductor device of claim 15 wherein said third wirings comprise output lines for said logic gate cells.

17. The semiconductor device of claim 5 wherein said second wiring layer further comprises power wirings extending in said first direction between said gate logic cells to provide a big power supply therefor.

* * * * *